United States Patent [19]

Wildi et al.

[11] Patent Number: 4,494,134
[45] Date of Patent: Jan. 15, 1985

[54] HIGH VOLTAGE SEMICONDUCTOR DEVICES COMPRISING INTEGRAL JFET

[75] Inventors: Eric J. Wildi, Clifton Park; Michael S. Adler, Schenectady, both of N.Y.

[73] Assignee: General Electric Company, Schenectady, N.Y.

[21] Appl. No.: 394,346

[22] Filed: Jul. 1, 1982

[51] Int. Cl.³ .............................................. H01L 27/02
[52] U.S. Cl. ........................................ 357/43; 357/22; 357/38; 357/89
[58] Field of Search .................... 357/22, 43, 38, 89

[56] References Cited

U.S. PATENT DOCUMENTS

| | | | |
|---|---|---|---|
| 3,812,405 | 5/1974 | Clark | 357/22 |
| 3,878,551 | 4/1975 | Callahan | 357/38 |

FOREIGN PATENT DOCUMENTS

| | | | |
|---|---|---|---|
| 53-67368 | 6/1978 | Japan | 357/43 |
| 55-96675 | 7/1980 | Japan | 357/43 |
| 56-8874 | 1/1981 | Japan | 357/43 |

OTHER PUBLICATIONS

J. Porter, "JFET-Transistor Yields Dev. W. Neg. Resistance," IEEE Trans. on Elec. Dev., Sep. 1976, vol. ED-23 #9, pp. 1098, 1099.

J. A. Appels & H. M. J. Vaes, "High Voltage Thin Layer Devices (RESURF Devices)", Proceedings of the 1979 IEEE International Electron Device Meeting, pp. 238-241.

S. Colak, B. Singer & E. Stupp, "Design of High-Density Power Lateral DMOS Transistors", Proceedings of the 1980 IEEE Power Electronics Specialists Conference, pp. 164-167.

R. S. Muller & T. I. Kamins, *Device Electronics for Integrated Circuits*, New York: John Wiley & Sons (1977), pp. 228-235.

A. B. Glaser & G. E. Subak-Sharpe, *Integrated Circuit Engrg.-Design, Fabricating & Applications*, Reading, Mass.: Addison-Wesley Co., (1979), pp. 254-255.

Primary Examiner—Joseph E. Clawson, Jr.
Attorney, Agent, or Firm—Charles E. Bruzga; James C. Davis, Jr.; Marvin Snyder

[57] ABSTRACT

A P-N diode includes a P⁻ substrate with a thin N⁻ epitaxial layer thereon. A P+ isolation region surrounds the periphery of the N⁻ epitaxial layer and is integrally connected to the P⁻ substrate. An N+ cathode region extends into the N⁻ epitaxial layer from the upper surface of such layer. A P+ anode region extends into the N⁻ epitaxial layer from its upper surface and surrounds the N+ cathode region. A further P+ region extends into the N⁻ epitaxial layer from its upper surface and surrounds the N+ cathode region, and, in turn, is surrounded by the P+ anode region. The further P+ region is biased at the same potential as the P⁻ substrate. An N+ buried layer is situated between the P⁻ substrate and the N⁻ epitaxial layer, beneath the P+ anode region, and surrounds the N+ cathode region. An N+ sinker region extends into the N⁻ epitaxial layer from its upper surface and terminates in integral contact with the N+ buried layer, the N+ sinker region surrounding the P+ anode region, and, in turn, being surrounded by the P+ isolation region. The N+ buried layer reduces parasitic currents in the P-N diode, and the further P+ region, appropriately biased, enables the P-N diode to block current at high reverse voltages. An N-P-N transistor is structurally similar to the P-N diode, having an additional N+ emitter region diffused into a P+ base region, corresponding to the P+ anode region of the P-N diode.

8 Claims, 4 Drawing Figures

HIGH VOLTAGE SEMICONDUCTOR DEVICES COMPRISING INTEGRAL JFET

BACKGROUND OF THE INVENTION

Our invention relates to semiconductor devices capable of supporting high reverse voltages while in a current-blocking state, and, more particularly, to such devices having highly-doped buried layers for reducing parasitic currents.

A typical prior art, high voltage P—N diode is described, for example, in an article by J. A. Appels and H. M. J. Vaes, "High Voltage Thin Layer Devices (RESURF Devices)", Proceedings of the 1979 IEEE International Electron Device Meeting, pages 238-241. The high voltage P—N diode described in such article includes a "P−", or lightly-doped, P type substrate with a thin N− epitaxial layer atop the substrate. A "P+", or highly-doped P type, isolation region surrounds the periphery of the N− epitaxial layer and is integrally connected to the P− substrate. The P+ isolation region and the P− substrate together implement the P type anode portion of the P—N diode. An N+ region extends into the center of the epitaxial layer's upper surface. The N+ the N− epitaxial layer, implement the N type cathode portion of the P—N diode.

Deficiencies exist in the foregoing arrangement of a prior art P—N diode. First, it is not possible for a plurality of such P—N diodes to be integrated in a single wafer of semiconductor material which possesses the beneficial capability of allowing independent biasing of each diode. This is because the P anode portion of each diode must be referenced to the same potential: namely, the potential of a P− substrate which constitutes a region in common with the respective anode portion of each P—N diode. A second deficiency is that the foregoing arrangement of a prior art P—N diode does not allow the integration of logic or analog semiconductor devices along with such P—N diode in the same wafer of semiconductor material. This is because a P− substrate, which would be common to both a logic or analog device and the P—N diode, would need to be referenced to the most negative potential of the wafer to enable proper operation of the logic or analog device. Proper operation of the P—N diode, however, incompatibly requires that its N− cathode portion be at a lower potential (i.e., by an amount equal to the inherent voltage of the diode than its P anode portion which includes the P− substrate.

The foregoing deficiencies may be overcome by implementing the P anode portion of a P—N diode as a separate P+ region which extends partially into the N− epitaxial layer from the upper surface of such layer and which surrounds the N+ cathode portion of the diode. The inclusion of the separate P+ anode portion in the P—N diode, however, would give rise to undesirable parasitic currents in the diode.

One such parasitic current would flow between the separate P+ anode portion and the P− substrate when the P—N diode were in its current-conducting state. This current typically would comprise most of the otherwise attainable P—N diode current and would constitute current in a parasitic P—N—P transistor formed from the separate P+ anode portion of the diode, the N− epitaxial layer, and the P− substrate. Another parasitic current could flow between the separate P+ anode portion and the P− substrate if the P—N diode were in its current-blocking state and a high voltage were present on the N+ cathode portion of the diode. In this situation, a depletion region, which would be induced in the N− epitaxial layer, would connect together the P+ anode portion and the P− substrate. Parasitic current would then flow between these regions when the P+ anode portion were biased sufficiently higher in potential than the P− substrate, as is typically the case, so that the potential in the depletion region would monotonically decrease from the P+ anode portion to the P− substrate. This condition is known as depletion layer punch-through. The foregoing parasitic currents would reduce the current density of the P—N diode and increase its heating losses.

The foregoing parasitic currents can be largely reduced or even eliminated by incorporating in the P—N diode an N+ "buried layer", or N+ region situated between the N− epitaxial layer and the P− substrate, beneath the P+ anode portion. In the case of parasitic current flowing in the parasitic P—N—P transistor, the level of such parasitic current is highly reduced because the N+ buried layer highly reduces the gain of the parasitic P—N—P transistor. In the other case of parasitic current flowing from the P+ anode portion to the P− substrate due to the existence of a continuous depletion region connecting these regions, the N+ buried layer typically eliminates this currents by preventing the formation of such continuous depletion region. However, the inclusion of the N+ buried layer in the P—N diode destroys the capacity of the diode to block current when a high reverse voltage is impressed across the diode (i.e., when its N+ cathode portion is biased at a high voltage with respect to its P+ anode portion). As used herein, "high voltage" signifies voltages in excess of about 20 volts that are typically encountered in semiconductor devices used in power switching applications, as opposed to logic switching applications. Accordingly, it would be desirable to provide a semiconductor device that overcomes the foregoing parasitic current problems, yet which retains unimpaired its capacity to block current at high reverse voltages.

While the foregoing deficiencies of prior semiconductor devices have been described with specific reference to P—N diodes, they are also encountered in high voltage N—P—N transistors which are structurally similar to the above-described P—N diodes, except for the inclusion of an N+ emitter region wholly within a P+ base region which corresponds to a P+ anode portion of a P—N diode.

SUMMARY OF THE INVENTION

Accordingly, it is an object of our invention to provide a high voltage semiconductor device which can be independently biased with respect to other devices integrated with such semiconductor device in a common wafer of semiconductor material.

A further object of our invention is to provide a high voltage semiconductor device which can properly function along with logic or analog devices integrated with such semiconductor device in a common wafer of semiconductor material.

Yet another object of our invention is to provide a high voltage semiconductor device in which parasitic currents are reduced to insignificant levels while retaining its capacity to block currents at high reverse voltages.

Briefly, in accordance with a preferred embodiment of our invention, we provide a semiconductor device comprising a P—N diode including a P⁻ substrate and a thin N⁻ epitaxial layer atop the P⁻ substrate. A P+ the periphery of the N⁻ epitaxial layer, and is integrally connected to the P⁻ substrate. An N+ cathode portion extends into the center of the N⁻ epitaxial layer from the upper surface of such layer. A P+ anode portion extends into the N⁻ epitaxial layer from its upper surface and surrounds the N+ cathode portion. An N+ buried layer, situated between the P⁻ substrate and the N⁻ epitaxial layer, beneath the P+ anode portion, surrounds the N+ cathode portion. A further P+ region extends into the N⁻ epitaxial layer from its upper surface and surrounds the N+ cathode portion, and, in turn, is surrounded by the P+ anode portion. A conductive path shorts together the further P+ region and the P⁻ substrate. The N+ layer reduces parasitic currents in the P—N diode, and the further P+ region enables the P—N diode to block current at high reverse voltages.

BRIEF DESCRIPTION OF THE DRAWINGS

While the specification concludes with claims particularly pointing out and distinctly claiming the subject matter which we regard as our invention, it is believed that the invention will be better understood from the following description, considered with reference to the drawings in which:

DETAILED DESCRIPTION OF THE INVENTION

Figure 1:
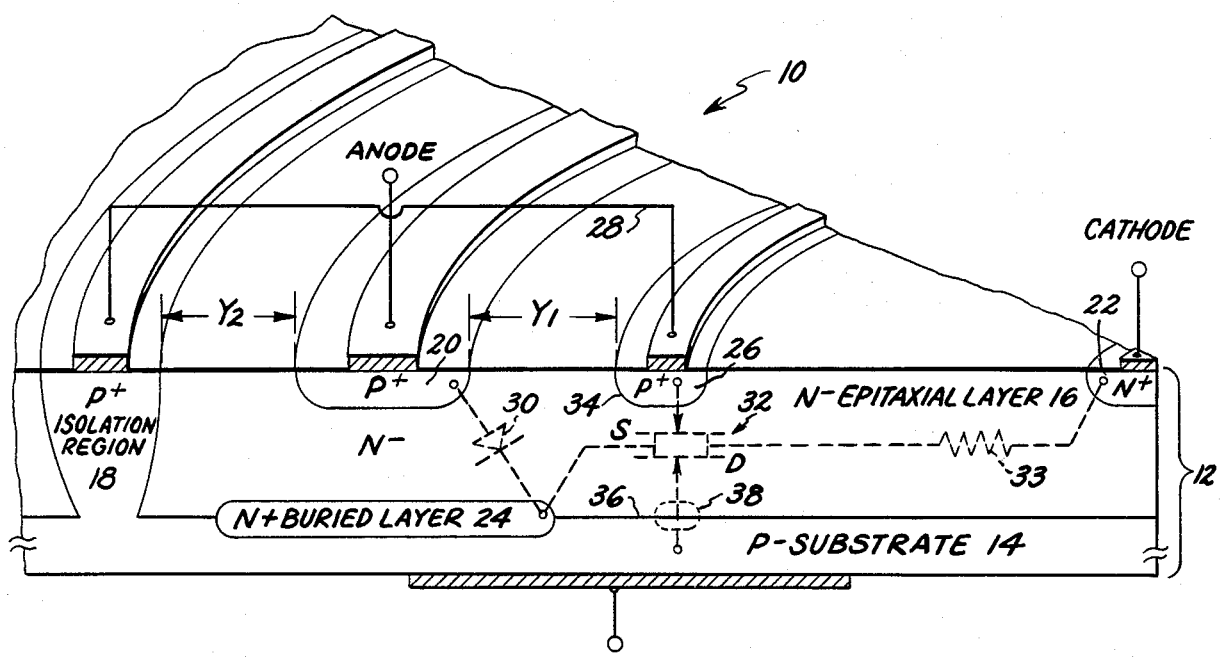
FIG. 1 is a view in perspective of a wedge of a semiconductor wafer, illustrating details of a P—N diode in accordance with our invention, with an explanatory circuit diagram being superimposed in dashed lines on the diode.

Turning to FIG. 1, there is shown a high voltage P—N diode 10 in accordance with one preferred embodiment of our invention. P—N diode 10 is embedded in a wafer 12 of semiconductor material, preferably comprising silicon, and includes a P⁻ substrate 14 and an N⁻ epitaxial layer 16, and is illutrated as being generally disc-shaped, although it may assume other shapes as will be apparent to those skilled in the art. Wafer 12 may include other semiconductor devices, such as other P—N diodes. P—N diode 10 is isolated from and and all of such other devices by P+ isolation region 18, which surrounds the periphery of P—N diode 10 and is integrally connected to P⁻ substrate 14.

P—N diode 10 includes an N+ cathode region 22 extending into N⁻ epitaxial layer 16 from the interior of its upper surface, preferably the center. P—N diode 10 further includes a P+ anode region 20 extending into N⁻ epitaxial layer 16 from its upper surface and surrounding N+ cathode region 22. In accordance with our invention, P—N diode 10 includes both an N+ buried layer 24 and a P+ region 26. N+ buried layer 24 is situated between N⁻ epitaxial layer 16 and P⁻ substrate 14, beneath P+ anode region 20, and surrounds N+ cathode region 22. P+ region 26 extends into N⁻ epitaxial layer 16 from its upper surface so as to form P—N junction 34. P+ region 26 surrounds N+ cathode region 22 and, in turn, is surrounded by P+ anode region 20. P+ region 26, in the particular embodiment illustrated, is biased at whatever potential P⁻ substrate 14 is biased because it is electrically shorted to P+ isolation region 18 via a conductor 28, and region 18 is integrally connected to P⁻ substrate 14.

The presence of N+ buried layer 24 in P—N diode 10 largely reduces or eliminates the parasitic currents that otherwise would flow between P+ anode region 20 and P⁻ substrate 14. (Such parasitic currents are discussed above, under "Background of the Invention"). However, further parasitic currents of undesirably high levels could also exist between P+ anode region 20 and each of P+ isolation region 18 and P+ region 26, inasmuch as both of these regions 18 and 26 have the same potential as P⁻ substrate 14. In order to reduce these further parasitic currents, spacing $Y_1$, between regions 20 and 26, and spacing $Y_2$, between regions 18 and 20, should be made sufficiently large.

If P+ region 26 were not included in P—N diode 10, the presence of N+ buried layer 24 would destroy the ability of P—N diode 10 to block current at high reverse voltages between its N+ cathode region 22 and its P+ anode region 20. This is because N+ buried layer 24, which is at a slightly lower potential than P+ anode region 20 when diode 10 is in its current-conducting state, would yield electrons to N+ cathode region 22, which is biased to a high positive potential when diode 10 is switched into its current-blocking state, until layer 24 rose in potential to the potential of N+ region 22. This would leave only the portion of N⁻ epitaxial layer 16 situated between P+ anode region 20 and $N^{30}$ buried layer 24 to "drop" or support the high reverse voltage across P—N diode 10. Since the N⁻ epitaxial layer is typically on the order of 100 microns in thickness, such portion of N⁻ epitaxial layer would inevitably break down and not be able to support the high reverse voltage. The presence of P+ region 26, appropriately biased (e.g., at the same potential as P⁻ substrate 14), results in the portion of N⁻ epitaxial layer 16 situated between P+ region 26 and N+ cathode region 22 supporting nearly all of the reverse voltage between N+ cathode region 22 and P+ anode region 20. Therefore, the capacity of P—N diode 20 to block current at high reverse voltage, which would otherwise be lost by the inclusion of N+ buried layer 24, is restored through the inclusion of P+ region 26, appropriately biased. This phenomenon, as well as further details of our invention, can be more easily understood with reference to the explanatory circuit diagram superimposed in dashed lines on P—N diode 10.

In the explanatory circuit diagram, a diode 30 represents an inherent P—N diode formed by P+ anode region 20 and the combination of N⁻ epitaxial layer 16 and N+ layer 24. A dual-gated Junction Field Effect Transistor (JFET) 32 represents an inherent JFET formed by N+ buried layer 24 (or source S of JFET 32), N⁻ epitaxial layer 16 (or drain D of JFET 32), and P+ region 26 along with P⁻ substrate 14(or the dual gates of JFET 32). The drain D of JFET 32 is connected to N+ cathod region 22 by an inherent series resistance 33, the value of which depends upon the resistivity of N⁻ epitaxial layer 16 and the voltage between N+ region 22 and P+ anode region 20.

When P—N diode 10 is switched from its current-conducting state to its current-blocking state (i.e., diode 10 becomes reverse-biased), the potential of N+ cathode region 22 rises to a value above that of P+ anode region 20, typically by as much as several hundred volts. N+ buried layer 24, which will have been biased at a slightly lower potential than P+ anode region 20 during the current-conducting state of P—N diode 10 (i.e., by an amount essentially equal to the inherent potential of P—N diode 10), now yields electrons to N+ cathode region 22, which is at a high potential. The potential of N+ buried layer 24 accordingly rises above its previous value, but only to a value at which electron flow from it to N+ cathode region 22 is pinched off by JFET 32.

Pinch-off of JFET 32 occurs when N+ buried layer 24 (or source S of JFET 32) attains a potential sufficiently above that of P+ region 26 and P− substrate 14 (or the gates of JFET 32) so as to achieve the following two conditions: (1) reverse bias P—N junctions 34 and 36 to such an extent that a continuous depletion region is formed in N− epitaxial layer 16 between P—N junctions 34 and 36: and (2) lower the potential of this region relative to the potential of N+ buried layer 24. Such a potential drop from N+ buried region 24 to the region between junctions 34 and 36 presents a potential barrier to electrons from buried layer 24 which otherwise would flow to N+ cathode region 22. When the potential of N+ buried layer is reduced to a value at which these two conditions are no longer present, JFET 32 is no longer pinched-off and can conduct electron current from N+ buried layer 24 to N+ cathode region 22.

When P—N diode 10 is switched from its current-blocking state to its current-conducting state, the potential of N+ buried layer 24 is forced to a value slightly below that of P+ anode region 20 (i.e., by the inherent potential of P—N diode 30). This eliminates the above-described conditions for pinch-off of JFET 32, enabling JFET 32 to conduct electrons from N+ buried layer 24 to N− cathode region 22.

One way to help ensure that the pinched-off condition of JFET 32 is eliminated when P—N diode 10 is in its current-conducting state is to bias the P+ region 26 to a potential above that of P− substrate 14. For instance, P+ region 26 could be connected to a voltage source (not shown), rather than to P− substrate 14 (via conductor 28 and P+ isolation region 18) as illustrated. However, the potential of P+ region 26 should not be very far above the potential of P− substrate 14 inasmuch as correspondingly less voltage will be dropped across the portion of N− epitaxial layer 16 between P+ region 26 and N+ cathode region 22 when P—N diode 10 is in its current-blocking state. Alternatively, an additional N+ buried region 38 (shown with a dashed-line boundary) could be provided, similar to N+ buried layer 24, to inhibit the formation of a continuous depletion layer between P+ region 26 and P− substrate 14.

A significant advantage attained by P—N diode 10 is the capability of properly functioning along with logic or analog devices fabricated in wafer 12, which requires that P− substrate 14 be at the same potential as the most negative potential of wafer 12. This is possible because both P+ anode region 20 and N+ cathode region 22 can be biased independently of P− substrate 14. A further significant advantage attained by P—N diode 10 is the capability of being independently biased with respect to other high voltage devices which are integrated in wafer 12. A yet further significant advantage attained by P—N diode 10 is that inherent P—N diode 30 can constitute a low voltage diode, provided that the maximum potential of N+ buried layer 24. occuring when P—N diode 10 is in its current-blocking state, is limited to a low value, for example, between 10 and 50 volts above the potential of P+ anode region 20. Voltages in this range are typical of voltages utilized by logic switching devices, as opposed to power switching devices. A low voltage diode can be more readily fabricated with higher precision than a high voltage diode, and accordingly, a manufactured batch of P—N diodes 10 can be more consistently alike.

Figure 2:
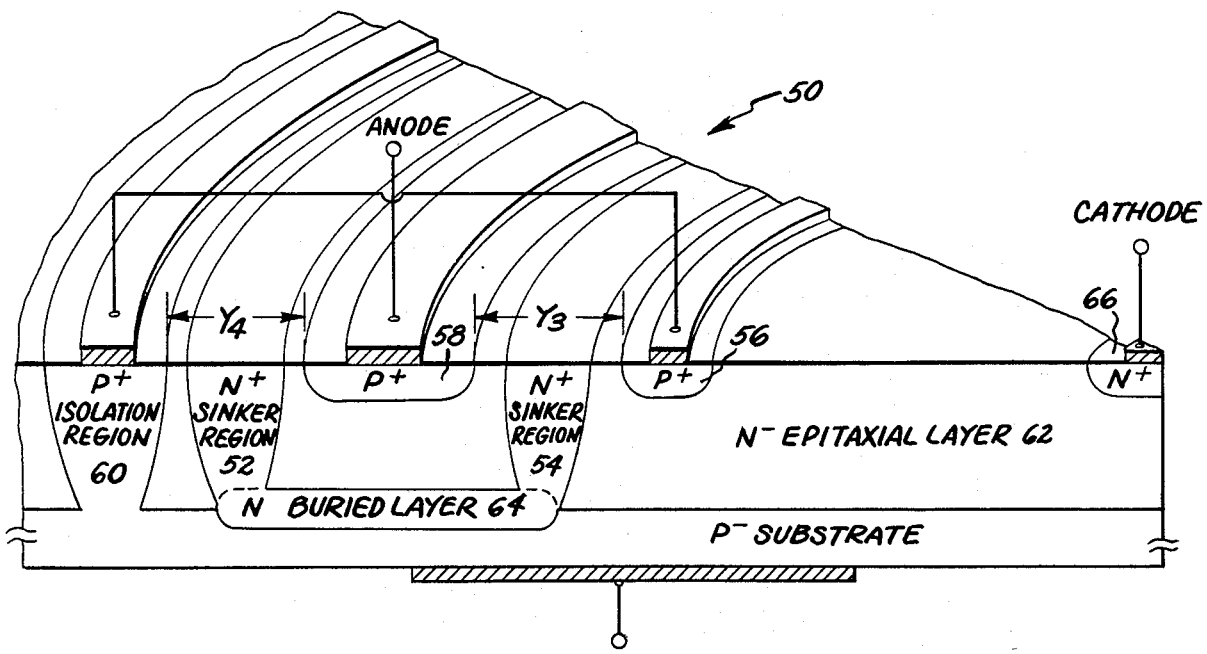
FIG. 2 is a view similar to FIG. 1, illustrating details of a further embodiment of a P—N diode in accordance with our invention.

Turning now to FIG. 2, a P—N diode 50 in accordance with a further preferred embodiment of our invention is shown. P—N diode 50 has essentially the same construction as P—N diode 10 (FIG. 1), except for the inclusion of N+ sinker regions 52 and 54, which make integral contact with N+ buried layer 64. The inclusion of N+ sinker regions 52 and 54 enables reduction of spacings $Y_3$ and $Y_4$ (corresponding to spacings $Y_1$ and $Y_2$, respectively, of FIG. 1, discussed above in regard to parasitic current flows), thereby resulting in a P—N diode 50 which can have a more compact size than P—N diode 10. N+ sinker regions 52 and 54 each extends into N− epitaxial layer 62 from the upper surface of layer 62 and terminates in integral contact with N+ buried layer 64. N+ sinker region 52 surrounds both N+ cathode region 66 and P+ anode region 58, and, in turn, is surrounded by P+ isolation region 60. N+ sinker region 54 surrounds N+ cathode region 66, as well as P+ region 56, and, in turn, is surrounded by P+ anode region 58.

Figure 3:
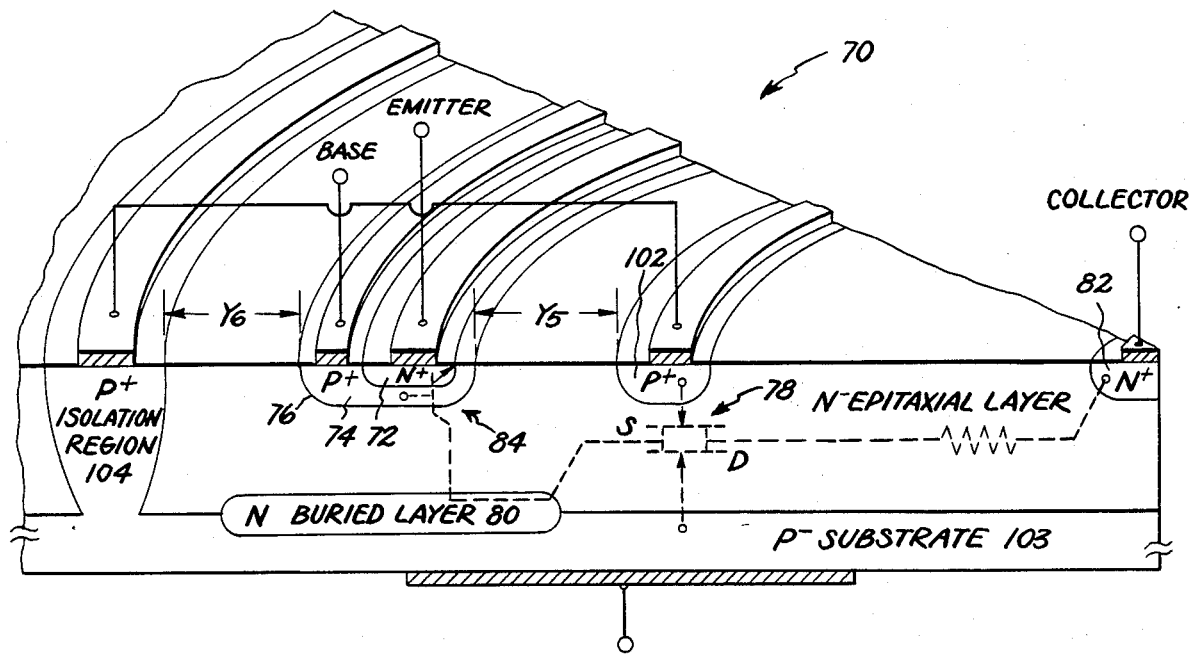
FIG. 3 is a view similar to FIG. 1, illustrating details of an N—P—N transistor in accordance with our invention, with an explanatory circuit diagram being superimposed in dashed lines on the transistor.

Turning now to FIG. 3, an N—P—N transistor 70 in accordance with a further preferred embodiment of our invention is illustrated. N—P—N transistor 70 has essentially the same construction as P—N diode 10 (FIG. 1), except that an N+ emitter region 72 is diffused into a P+ base region 74, which corresponds to P+ anode region 20 of P—N diode 10. N+ region 82 functions as the collector region.

N—P—N transistor 70 has three possible states of operation: (1) a current-blocking state in which its inherent JFET 78 is pinched off, similar to the pinched-off condition of JFET 32 of P—N diode 10 (FIG. 1) when diode 10 is in its current-blocking state; (2) a saturation state in which N buried layer 80 is forced to about 0.1 volt above the potential of N+ emitter region 72, causing JFET 78 to conduct electrons, in similar manner as the conducting condition of JFET 32 of P—N diode 10 when diode 10 is in its current-conducting state; and (3) an active state in which JFET 82 is neither fully pinched-off nor fully conducting.

With N—P—N transistor 70 in its active state, N emitter 72 injects electrons into N+ buried layer 80, causing the positive potential of layer 80 to fall and eliminating the two conditions required for JFET 78 to pinch-off: namely (1) eliminating the potential barrier to electron flow into the region between P+ region 102 and P− substrate 103, and then (2) reducing the extent of the depleted area in this region. Accordingly, JFET 78 becomes self-biased into a higher conductivity state. As a result, an enhanced electron flow from N+ to N+ collector region 82 ensues, which, if not accompanied by a correspondingly enhanced electron flow from N+ emitter region 72 to N+ buried layer 80, results in an increase in the positive potential of N+ buried layer 80, and, hence, the tendency of JFET 78 to pinch-off. As a result of these two opposed tendencies of biasing JFET 78, a stable operating point is reached wherein JFET 80 conducts a continuous electron current from N+ emitter region 72 to N+ collector region 82, via N+ buried layer 80.

N—P—N transistor 70 contains an inherent low voltage N—P—N transistor 84 (shown in dashed lines), and, accordingly, a batch of substantially identical N—P—N transistors 70 can be readily fabricated.

Figure 4:
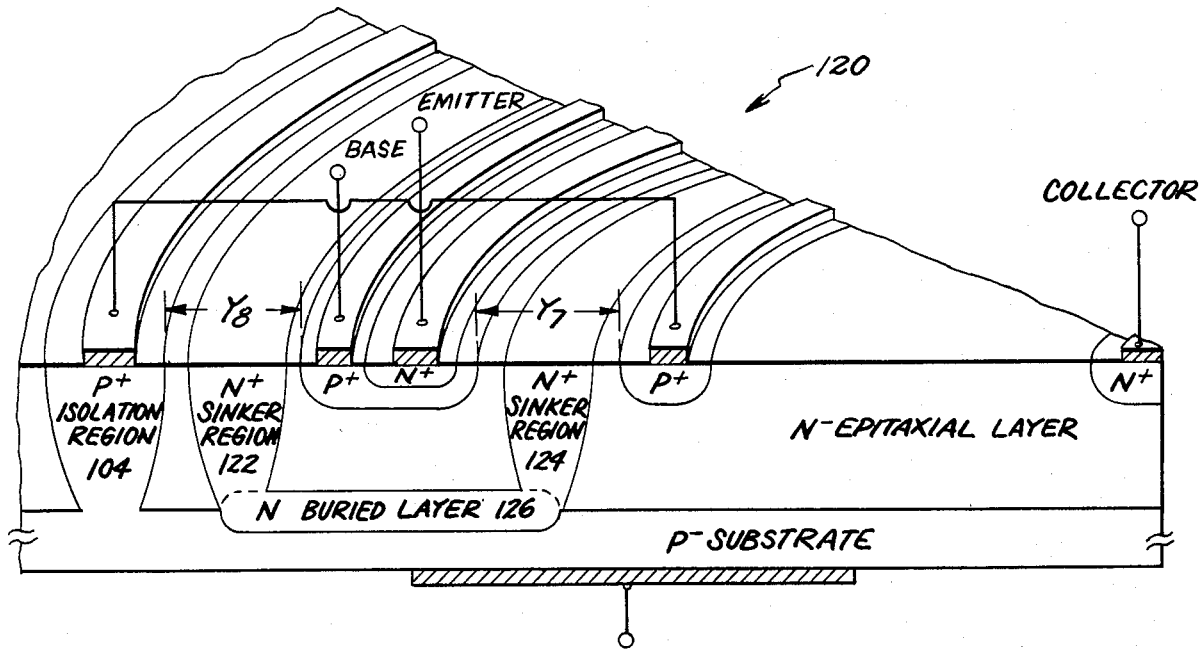
FIG. 4 is a view similar to FIG. 1, illustrating details of a further embodiment of an N—P—N transistor in accordance with our invention.

If N—P—N transistor 70 is to be operated in a saturated condition, spacings $Y_5$ and $Y_6$ should be maintained sufficiently large for reducing the parasitic currents which correspond to the parasitic currents reduced in P—N diode 10 (FIG. 1) by virtue of the spacings $Y_1$ and $Y_2$ therein In a preferred embodiment alternative to N—P—N transistor 70, an N—P—N transistor 120, illustrated in FIG. 4, includes N+ sinker regions 122 and 124 for allowing spacings $Y_7$ and $Y_8$ (which correspond to spacings $Y_5$ and $Y_6$, respectively, of N—P—N transistor 70) to be reduced, resulting in a more compact N—P—N transistor 120.

In fabricating the semiconductor devices described herein, each of the various regions extending into the N⁻ epitaxial layers from their respective upper surfaces are suitably formed by the technique of diffusion or of ion implantation. Similarly, the N+ emitter regions of the N—P—N transistors described above can be formed by the technique of diffusion or of ion implantation. The N+ buried layers are suitably formed by ion implanting N type dopant impurities into the upper surface of the respective P⁻ substrates prior to the growing of the respective N⁻ epitaxial layers on the substrates. The N+ region 38 of P—N diode 10 (FIG. 1) is suitably formed in like manner as the N+ buried layers, just discussed.

In the best mode we contemplate for practising our invention, the product of the thickness and doping concentration of the N⁻ epitaxial layers of the devices described herein are selected in accordance with Reduced Surface Field(or RESURF) Technology in order to maximize the reverse voltages attainable by the devices. Details of RESURF Technology may be found, for example, in the above-referenced article by J. A. Appels and H. M. J. Vaes, as well as in an article by S. Colak, B. Singer and E. Stupp, "Design of High-Density Power Lateral DMOS Transistors", Proceedings of the 1980 IEEE Power Electronics Specialists Conference, pages 164–167.

The foregoing describes various embodiments of a high voltage semiconductor device which can be integrated in a common semiconductor wafer along with other semiconductor devices, including logic or analog devices, each device in the wafer being capable of independent biasing. The high voltage semiconductor device additionally can block current at high reverse voltage without significant levels of internal parasitic currents.

While our invention has been described with respect to specific embodiments, many modifications and substitutions will be apparent to those skilled in the art. For example, complementary semiconductor devices could be made, in which P type material is used rather than N type material, and vice-versa. It is, therefore, to be understood that the appended claims are intended to cover these and all such modifications and substitutions as fall within the true spirit and scope of our invention.

What we claim as our invention and desire to have secured by Letters Patent of the United States is:

1. In a semiconductor device of the type including a bulk substrate of one dopant type, a layer of opposite dopant type disposed atop the substrate, an isolation region of same dopant type as the substrate integrally connected to the substrate and adjoining the periphery of the layer, a first region of the opposite dopant type extending into the layer from the interior of the upper surface thereof, and a second region of the one dopant type extending into the layer from the upper surface thereof and surrounding the first region, the improvement comprising (a) a third highly doped region of the opposite dopant type disposed between the layer and the substrate, beneath the second region and surrounding the first region;

(b) a fourth region of the one dopant type extending into the layer from the upper surface thereof, the fourth region surrounding the first region and, in turn, being surrounded by the second region; and (c) means for biasing the fourth region to a potential proximate that of the substrate so as to increase the maximum attainable voltage between the first and second regions when the semiconductor device is in a current-blocking state.

2. The invention according to claim 1, further comprising a fifth region of the opposite dopant type extending into the layer from the upper surface thereof and terminating in integral contact with the third region, the fifth region surrounding the second region, and, in turn, being surrounded by the isolation region.

3. The invention of claim 2, further comprising a sixth region of the opposite dopant type extending into the layer from the upper surface thereof and terminating in integral contact with the third region, the sixth region surrounding the fourth region, and, in turn, being surrounded by the second region.

4. The invention of claim 1, further comprising an additional region of the opposite dopant type being disposed between the layer and the substrate, beneath the fourth region, surrounding the first region, and, in turn, being surrounded by the third region.

5. The invention according to claim 1 or 2, further comprising an additional region of the opposite dopant type formed entirely within the second region and extending into the second region from the upper surface thereof so as to surround the first region.

6. The invention according to claim 1, wherein the means for biasing the fourth region comprises a conductor connecting together the fourth region and the isolation region.

7. The invention according to claim 1, wherein the one dopant type is P type and the opposite dopant type is N type.

8. The invention according to claim 7, wherein the semiconductor device comprises silicon semiconductor material.

* * * * *